United States Patent [19]

Fifield et al.

[11] Patent Number: 4,686,171
[45] Date of Patent: Aug. 11, 1987

[54] PHOTOPOLYMERIZABLE FILMS CONTAINING PLASTICIZER SILICA COMBINATIONS

[75] Inventors: Charles C. Fifield, Wilmington; Richard T. Mayes, Greenville; Marilyn Tate, Newark; Daniel F. Varnell, Wilmington, all of Del.

[73] Assignee: Hercules Incorporated, Wilmington, Del.

[21] Appl. No.: 830,024

[22] Filed: Feb. 14, 1986

[51] Int. Cl.$^4$ ................................................. G03C 1/76
[52] U.S. Cl. ..................................... 430/273; 430/281; 430/912; 522/95; 522/78; 522/79
[58] Field of Search ....................... 430/912, 281, 273; 522/95, 78, 79

[56] References Cited

U.S. PATENT DOCUMENTS

| | | | |
|---|---|---|---|
| 3,615,448 | 10/1971 | Neshin | 430/912 |
| 4,306,012 | 12/1981 | Scheve | 430/296 |
| 4,379,039 | 4/1983 | Fujimoto et al. | 522/40 |

FOREIGN PATENT DOCUMENTS 0133265 2/1985 European Pat. Off. .
1580865 12/1980 United Kingdom .

*Primary Examiner*—Jack P. Brammer
*Attorney, Agent, or Firm*—Marion C. Staves; William E. Player; John P. Luther

[57] ABSTRACT

Disclosed is an aqueous developable, photopolymerizable composition having increased flexibility and reduced cold flow comprising a unique mixture of a siliceous material and a plasticizer in combination with known photopolymerizable monomers, polymeric binders, thermal polymerization inhibitors, and photoinitiators.

12 Claims, No Drawings

PHOTOPOLYMERIZABLE FILMS CONTAINING PLASTICIZER SILICA COMBINATIONS

This invention relates to aqueous developable photopolymerizable compositions. In particular, it relates to said compositions in the form of a dry (i.e., non-solvated) film.

Photopolymerizable compositions comprising a carboxyl group-containing, film-forming polymeric binder, an addition photopolymerizable monomer, a thermal polymerization inhibitor and a free radical photoinitiator are known. Referred to as "dry films", these compositions are developable by aqueous media because of the presence of the carboxyl groups in the polymeric binder and are often sold as a roll of dry film sandwiched between a flexible support member and a flexible cover member.

A problem encountered in the use of aqueous developable dry films is maintaining flexibility of the composition after polymerization while controlling cold flow in the unpolymerized composition.

It is desirable to have post-polymerization flexibility in compositions used as photoresists in the manufacture of printed circuit boards. Line trimming, and the use of flexible circuit boards require a flexible, polymerized photoresist. The more flexible the composition is in the polymerized state, the less likely it is to crack and break away from the circuit board during board flexing or line trimming.

In the past maintaining post-polymerization flexibility has been accomplished by the addition of plasticizers. However, the plasticizers used in the past have tended to increase cold flow in the unpolymerized composition.

The undesirability of cold flow is particularly pronounced when the compositions are commercially supplied as laminated rolls of photopolymerizable film sandwiched between a flexible support member and a flexible cover member. Cold flow causes the composition to ooze out from between successive layers of the support and cover members, and the composition then harden on the edge of the roll, a phenomenon known as edge fusion. Edge fused rolls are difficult, and sometimes impossible to unroll. When they are unrolled, some of the composition is often delaminated.

Therefore, it is an object of the instant invention to reduce the cold flow of photopolymerizable dry film while increasing the post-polymerization flexibility of the dry film. This is accomplished in the instant invention by the use of a unique combination of certain silicas and plasticizers.

The use of silicas in aqueous developable, photopolymerizable compositions has been heretofore unknown.

A unique combination of silicas and plasticizers is now disclosed that when used in conjunction with known polymeric binders, photopolymerizable monomers, thermal polymerization inhibitors, and free radical photoinitiators results in a photopolymerizable composition having reduced cold flow while exhibiting excellent flexibility in the polymerized state.

According to the instant invention, a photopolymerizable composition that comprises a carboxyl group-containing, film-forming polymeric binder, a free radical photoinitiator, an addition photopolymerizable monomer, and a thermal polymerization inhibitor is characterized in that the composition further comprises:

(a) at least one plasticizer, wherein the plasticizer is tri-n-butyl citrate, N-ethyl-toluene sulfonamide, glycerol triacetate, or a reaction product of (i) an isocyanate terminated block copolymer of polyesterdiol blocks and polyalkylene glycol/ethylene oxide blocks and (ii) at least one hydroxy-substituted acrylate or methacrylate; and (b) a siliceous material, wherein the siliceous material is precipitated silica, a combination of fumed silica and alumimum oxide, or a mixture thereof.

Precipitated silica, as is well known in the art, is made by the controlled neutralization (with a mineral acid) of a sodium silicate solution.

Fumed silica (also known as pyrogenic silica), as is well known in the art, is a product of high temperature pyrolysis of silicon-containing compounds, such as silicon tetrachloride.

The precipitated silica used in accordance with the instant invention has a particle size of less than about 10 microns, preferably less than about 0.02 microns.

The fumed silica used in accordance with this invention has a particle size of less than about 10 microns, preferably less than about 0.012 microns.

The aluminum oxide used in accordance with the instant invention has an average particle size of less than about 10 microns, preferably less than about 0.02 microns.

N-ethyl-toluene sulfonamide includes N-ethyl-orthotoluene sulfonamide, N-ethyl-para-toluene sulfonamide, or a mixture thereof.

The ratio, in parts by weight, of fumed silica to aluminum oxide used in accordance with this invention is from about 4/1 to about ⅔, preferably from about 3/1 to about 2/1 respectively.

Both fumed silica and precipitated silica are discussed in detail in Ed Galli, "Thixotropes", *Plastics Compounding*, May/June 1984, pp. 53–66, incorporated herein by reference.

The reaction product of the isocyanate terminated block copolymer of polyesterdiol blocks and polyalkylene glycol/ethylene oxide blocks and the hydroxy substituted acrylate or methacrylate useful in accordance with the instant invention is made by methods well known to those skilled in the art, such as disclosed in U.S. Pat. No. 3,960,572, incorporated herein by reference. Useful polyesterdiols are, for example, polyethylene adipatediol, polypropylene adipatediol, polybutylene adipatediol, polyhexamethylene adipatediol, and polyethylene succinatediol. Polyethylene adipatediol is preferred. Useful polyalkylene glycols are, for example, ethylene glycol, and propylene glycol. Ethylene glycol is preferred. Diisocyanates useful in terminating the block copolymer are, for example, toluene diisocyanate and paraphenylene diisocyanate. Toluene diisocyanate is preferred. Useful hydroxy substituted acrylates or methacrylates are, for example, 2-hydroxyethyl acrylate or methacrylate, hydroxypropyl acrylate or methacrylate, and polypropylene glycol monomethacrylate. Hydroxypropyl methacrylate and polypropylene glycol monomethacrylate are preferred. Examples of the useful rection product of an isocyanate terminated block copolymer and a hydroxy substituted acrylate or methacrylate are disclosed in the hereinabove mentioned U.S. Pat. No. 3,960,572, as are other diisocyanates, polyesterdiols, polyalkylene glycols, and hydroxy substituted acrylates or methacrylates useful therein. A preferred molar ratio is 1:1:3-2 (polyesterdiol:polyalkylene glycol/ethylene oxide:isocyanate) and 1:2–2.5 (isocyanate:hydroxy substituted acrylate or methacrylate).

Based on the total weight of the photopolymerizable composition of this invention: (a) the amount of precipitated silica or combination of fumed silica and aluminum oxide varies from about 10% to about 25%, preferably from about 13% to about 19%; (b) the amount of plasticizer varies from about 5% to about 20% preferably from about 9% to about 15%; the amount of photopolymerizable monomer varies from about 5% to about 40%, preferably from about 15% to about 25%; the amount of photoinitiator varies from about 2% to about 10%, preferably, from about 3% to about 7%; the amount of the polymeric binding agent varies from about 30% to about 75%, preferably 45% to about 60%; the amount of thermal polymerization inhibitor varies from about 0.003% to about 0.04%, preferably from about 0.01% to about 0.02%.

The free-radical photoinitiator useful in accordance with this invention is a conventional photoinitiator activatable by actinic radiation that is thermally inactive below about 185° C. Examples of useful photoinitiators are found in U.S. Pat. No. 4,268,610, incorporated herein by reference. Preferable photoinitiators are aromatic ketones, such as benzophenone. Other useful photoinitiators will be apparent to those skilled in the art.

The polyfunctional addition photopolymerizable monomer that finds application in the subject invention is nongaseous, contains at least 2, preferably 2 to 4, more preferably 2 to 3 ethylenic double bonds. Having at least 2 ethylenic double bonds makes the monomer polyfunctional, i.e., capable of cross-linked polymerization. Suitable monomers include alkylene or polyalkylene glycol diacrylates. Monomers containing vinylidene groups conjugated with ester linkages are particularly suitable. Illustrative examples include but are not limited to ethylene diacrylate; diethylene glycol diacrylate; glycerol diacrylate; glycerol triacrylate; 1,3-propanediol dimethacrylate; 1,2,4-butanetriol trimethacrylate; 1,4-benzenediol dimethacrylate; 1,4-cyclohexanediol diacrylate; pentaerythritol tri- and tetramethacrylate; pentaerythritol tri- and tetraacrylate; tetraethylene glycol dimethacrylate; trimethylolpropane trimethacrylate; triethylene glycol diacrylate; tetraethylene glycol diacrylate; pentaerythritol triacrylate; trimethylol propane triacrylate; pentaerythritol tetraacrylate; 1,3-propanediol diacrylate; 1,5-pentanediol dimethacrylate; and the bis-acrylates and bis-methacrylates of polyethylene glycols, polypropylene glycols, and copolymers thereof of molecular weight from about 100 to about 500 (number average). Other useful photopolymerizable monomers will be apparent to those skilled in the art.

The thermal polymerization inhibitor useful in accordance with the instant invention prevents thermal polymerization during drying and storage. Examples of useful thermal polymerization inhibitors are p-methoxyphenol, hydroquinone, alkyl and aryl-substituted hydroquinones and quinones, tertbutyl catechol, pyrogallol, copper resinate, β-naphthol, 2,6-di-tert-butyl-p-cresol, 2,2′-methylene-bis(4-ethyl-6-t-butylphenol), p-tolylquinone, chloranil, aryl phosphites, and aryl alkyl phosphites. Other useful thermal polymerization inhibitors will be apparent to those skilled in the art.

The carboxyl group containing film-forming polymeric binder useful in accordance with this invention is prepared from one or more film-forming, vinyl type monomers and one or more alpha, beta ethylenically unsaturated carboxyl group containing monomers having 3–15 carbon atoms, which makes the binder soluble in aqueous media. Examples of useful vinyl type monomers are alkyl and hydroxyalkyl acrylates and methacrylates having 3–15 carbon atoms, styrene, and alkyl substituted styrenes. The acrylates and methacrylates are preferred. Examples of useful carboxyl group-containing monomers are cinnamic acid, crotonic acid, sorbic acid, acrylic acid, methacrylic acid, itaconic acid, propiolic acid, maleic acid, fumaric acid, and half esters and anhydrides of these acids. Acrylic acid and methacrylic acid are preferred. Examples of useful binders are found in U.S. Pat. No. 4,539,286, incorporated herein by reference. Other useful binders will be apparent to those skilled in the art.

In a prefered embodiment, a monofunctional carboxyl group-containing addition photopolymerizable monomer is added to the photopolymerizable composition of the instant invention. The monofunctional (i.e., containing one ethylenic double bond) carboxyl group containing monomer is preferably used because the photopolymerized material made from the photopolymerizable composition is then strippable from a substrate in small pieces, while without this monomer, the photopolymerized material strips well, but in large sheets. Stripping in small pieces is preferred since the photopolymerized material between fine lines is more easily removed. Also, some stripping apparatuses have filtration systems that could have clogging problems if stripping occurs in large sheets. Based on the weight of the photopolymerizable composition of the instant invention, the amount of the monofunctional carboxyl group-containing addition photopolymerizable monomer used is preferably from about 1% to about 10%, more preferably from about 1.5% to about 6%. Useful monofunctional carboxyl group-containing addition photopolymerizable monomers are, for example, itaconic acid, beta-carboxyethylacrylate, citraconic acid, crotonic acid, monomethacryloyloxyethyl phthalate, monoacryoyloxyethyl phthalate, and fumaric acid. Itaconic acid and beta-carboxyethylacrylate are preferred. Other useful monomers will be apparent to those skilled in the art.

The photopolymerizable composition of this invention optionally includes additives well known in the art of photopolymerizable compositions, such as leuco (i.e., printout) dyes, background dyes, adhesion promoters, and antioxidants as disclosed in U.S. Pat. No. 4,297,435, incorporated herein by reference, and the heretofore mentioned U.S. Pat. No. 4,268,610. Other optional additives will be apparent to those skilled in the art. While desirable, the optional additives are not essential to the instant invention.

The photopolymerizable composition of this invention is prepared by mixing the various components in a solvent. Mixing must be sufficient to evenly disperse the siliceous material throughout the mixture. Suitable solvents are alcohols, ketones, halogenated hydrocarbons, and ethers. Other solvents will be apparent to those skilled in the art. After mixing, the composition is then coated onto a support, and the solvent is evaporated. U.S. Pat. Nos. 3,469,982 and 4,293,635, incorporated herein by reference, disclose useful methods for preparing the photopolymerizable composition of this invention, i.e., as rolls of dry film sandwiched between a flexible support member and a flexible cover member. It will be apparent to those skilled in the art that dry films of the instant invention can be made on inflexible supports as well as flexible supports and may be supplied as stacks of laminated sheets as disclosed in the heretofore mentioned U.S. Pat. No. 4,268,610, as well as rolls.

In a preferred embodiment, the photopolymerizable composition of this invention is used as a photoresist in the manufacture of printed circuit boards. Generally, the composition is coated onto the copper surface of a copper clad substrate, exposed to actinic radiation through a negative to create a latent image of photopolymerized material, and developed in a known aqueous developing solution to remove the unpolymerized composition from the copper surface. The portions of the surface not covered by the photopolymerized material are then modifiable by known processes, e.g., by plating or etching procedures, while the photoresist protects the covered surface. The photopolymerized material can be ultimately removed from the substrate by washing with known stripping solutions.

The photopolymerizable composition of the instant invention is applied to the copper clad substrate by known procedures, such as hot shoe or hot roll lamination of the dry film attached to a transparent, peelable support, which support is removed after polymerization, as disclosed in the heretofore mentioned U.S. Pat. No. 4,293,635. Generally, the amount of actinic radiation used to polymerize the composition varies from about 35 to about 150 mJ/cm$^2$, with precise amounts determinable by those skilled in the art based on the specific composition used.

The copper clad substrate is any known copper/dieletric laminate used in circuit board manufacture, such as a copper clad board of fiberglass reinforced epoxy resin. Other useful dielectrics will be apparent to those skilled in the art.

The aqueous developing solutions used in accordance with this invention have, by weight, about 0.5-10% alkaline agents, preferably about 0.5-1%, and the latent imaged board is washed in the solution for a time sufficient to remove the unpolymerized composition. Useful alkaline agents are alkalai metal hydroxides, e.g., lithium, sodium and potassium hydroxide, the base reacting alkali metal salts of weak acids, e.g., sodium carbonate and bicarbonate, and alkalai metal phosphates and pyrophosphates. Sodium carbonate is preferred. The circuit board can be submerged in the developing solution or, preferably, the solution is high pressure sprayed on the board.

In general, the stripping solutions useful in removing the photopolymerized material in accordance with the instant invention are heated aqueous alkaline solutions, using the same alkaline agents as the developing solutions, but having a higher alkaline concentration, i.e., generally, by weight, from about 1%-10%, preferably from about 1%-3%. Generally, the stripping solution is heated to a temperature of about 45° C.-65° C., preferably about 50° C.-55° C. Washing the substrate to remove the photopolymerized material is by methods well known to those skilled in the art, such as spraying the substrate with the heated stripping solution or, preferably, agitating the substrate in a heated bath of the stripping solution.

Examples of the photoimaging techniques and equipment, including radiation sources, exposure intensity and duration, developing and stripping solutions and techniques, and laminated board composition useful in the preferred embodiment are disclosed in the heretofore described U.S. Pat. Nos. 3,469,982, 4,293,635, and 4,268,610.

As stated previously, one of the advantages of the composition of the present invention is that it remains flexible upon photopolymerization. This advantage is important in view of the possible uses of the composition and the processing steps commonly encountered in circuit board manufacture. In particular, flexing of laminated substrates will not cause cracking when using the photopolymerized material of this invention. Even where flexible substrates are not employed, the flexible nature of the photopolymerized material helps to prevent chipping as the laminated boards are handled (e.g., by stacking).

Of course, it will be apparent that the composition of the instant invention is useful in solvated form. For example, in silk screen printing techniques for circuit board manufacture, the composition of the instant invention is applied to circuit boards in solvated form. Screen printing techniques are disclosed in *Printed Circuit Handbook*, 2nd edition, ed. by Clyde F. Coombs, Jr., (1979), incorporated herein by reference. Also, in photoimaging techniques as described in the preferred embodiment herein, the composition can be coated onto the substrate in solvated form, and the solvent then evaporated.

To more adequately describe the invention, the following Examples and Controls are included. However, the instant invention is not intended to be limited thereby. All parts and percentages in the Examples and Controls are by weight unless otherwise indicated.

EXAMPLE 1

This example illustrates a photopolymerizable composition of this invention and its reduced cold flow. The photopolymerizable composition is prepared using the ingredients listed below:

| Ingredient | Parts Example 1 | Control |
|---|---|---|
| butylated hydroxy toluene (antioxidant) | .008 | .01 |
| DMPAP[1] (photoinitiator) | 4 | 4 |
| PBCH[2] (print-out dye developer) | .656 | .8 |
| TDA[3] (polymerizable monomer) | 5.04 | 6.15 |
| TMPTA[4] (polymerizable monomer) | 5.04 | 6.15 |
| acrylic binder[5] | 34.25 | 41.75 |
| precipitated silica[6] | 8.52 | — |
| glycerol triacetate (plasticizer) | 8.94 | — |
| leuco crystal violet (print-out dye) | .115 | .14 |
| blue dye solution[7] (background dye) | .39 | .48 |
| methyl ethyl ketone (solvent) | 27.5 | 20 |

[1] dimethoxyphenyl acetophenone
[2] pentabromo monochloro cyclohexane
[3] triethylene glycol diacrylate
[4] trimethylol propane triacrylate
[5] prepared from 49.5% ethyl methacrylate, 35.5% ethyl acrylate, and 15% methacrylic acid, dissolved in methyl ethyl ketone
[6] median agglomerate size = 1.4 micrometers; average particle size = 21 nanometers, surface size area = 150 m$^2$/gm
[7] methanol, victorian blue, and brilliant green The ingredients are mixed thoroughly using a mechanical stirrer at room temperature for six hours at 1000 rpm.

Sample rolls of film using the compositions of Example 1 and the Control are made, and the films are sandwiched between a polyester film support and a polyethylene cover sheet. The rolls are dried in forced hot air ovens at 155°-212° F. The resulting dry film thickness is about 40 micrometers.

Samples of these films are tested for complex viscosity. Complex viscosity measurements are made with a Rheometrics Mechanical Spectrometer (RMS) at 60° C.

To take the measurements, the support and cover sheets are removed and successive layers of dry film are stacked to make an 80 mil thick test sample.

Edge fusion tests are run at 85° F. in 50% relative humidity and 80% relative humidity. Two Examples and two Control rolls are tested at both humidity levels. Complex viscosity is recorded in Table 1 and Edge fusion tests are recorded in Tables 2 and 3 below. Edge fusion is recorded as 0=none, 1=very slight, 2=slight, 3=moderate and somewhat functionally defective, and 4=severe and unquestionably a reject film. Edge fusion is measured up to 28 days.

TABLE 1

| Sample | Complex Viscosity (poise) |
|---|---|
| Example 1 | $7.8 \times 10^6$ |
| Control | $2.2 \times 10^6$ |

TABLE 2

| | Edge Fusion @ 85° F. and 50% RH | | | | | | |
|---|---|---|---|---|---|---|---|
| | DAYS | | | | | | |
| Sample | 3 | 5 | 7 | 10 | 14 | 21 | 28 |
| Example | 0 | 0 | 1 | 2 | 2 | 2 | 2 |
|  | 0 | 1 | 2 | 2 | 2 | 2 | 2 |
| Control | 1 | 1 | 2 | 2 | 2–3 | 3–4 | — |
|  | 0 | 1 | 2 | 2 | 2–3 | 4 | — |

TABLE 3

| | Edge Fusion @ 85° F. and 80% RH | | | | | | |
|---|---|---|---|---|---|---|---|
| | DAYS | | | | | | |
| Sample | 1 | 3 | 5 | 7 | 10 | 14 | 21 | 28 |
| Example | 0 | 0 | 1 | 1 | 2 | 2–3 | 3 | — |
|  | 0 | 0 | 0 | 0 | 1 | 2 | 2 | 3 |
| Control | 0 | 1 | 2–3 | 3 | 3–4 | — | — | — |

Tables 1, 2, and 3 show that the composition of this invention has reduced cold flow over the same composition without plasticizer and precipitated silica. Furthermore, the Tables show that an increase in complex viscosity results in an increased resistance to cold flow.

EXAMPLE 2

To show the superiority of the precipitated silica/plasticizer containing compositions of the instant invention over compositions containing precipitated silica alone and plasticizer alone, a composition is prepared using the formulation of Example 1 and three control films are prepared that are identical except that one contains no precipitated silica and plasticizer, one contains precipitated silica alone (no plasticizer), and the third contains plasticizer alone (no precipitated silica). The ingredients are intimately mixed for several hours at 1,000 rpm. The mixture is then coated with a doctor blade onto a polyester support film and the solvent evaporated by air drying for about 16 hr. Dry film thickness is about 38 micrometers.

Complex viscosity mesurements (RMS @60° C.) are made.

Samples of the films are laminated to scrubbed copper laminate panels, using a hot shoe laminator at 235° F. at four feet per minute. The films are then exposed to a medium pressure Hg lamp and developed in a 0.75% sodium carbonate solution at 85° F.

Chipping of polymerized films is an indication of poor flexibility. To test for flexibility, the sample polymerized films are cut with a razor blade drawn at a 90° angle to the plane of the films.

An attempt to laminate the control film containing silica alone is unsuccessful because it has poor adhesion and it is so brittle it cracks, even in its unpolymerized state. Complex viscosity cannot be measured either for the same reasons.

Complex viscosities and razor test results are recorded in Table 4 below:

TABLE 4

| | Complex Viscosity (poise) | Razor Cut |
|---|---|---|
| Example 2 | $5.2 \times 10^6$ | no chipping |
| Control (no silica and plasticizer) | $1.5 \times 10^6$ | chips badly |
| Control with silica | (too brittle to test) | (too brittle to test) |
| Control with plasticizer | $1.35 \times 10^5$ | no chipping |

The results show that adding precipitated silica and plasticizer according to the instant invention increases the complex viscosity, which is a measure of resistance to cold flow and decreases chipping, which is a measure of increased post-polymerization flexibility, while using precipitated silica alone actually increases chipping and using plasticizer alone actually decreases complex viscosity.

EXAMPLE 3

A film of the composition of this invention is prepared using the procedures of Example 2 and the following formulation:

| Ingredient | Parts |
|---|---|
| butylated hydroxy toluene | .008 |
| DMPAP | 4 |
| PBCH | .65 |
| acrylic binder (as in Example 1) | 34.3 |
| TMPTA | 5.1 |
| TDA | 5.1 |
| precipitated silica (as in Example 1) | 8.52 |
| plasticizer (described below) | 13.3 |
| leuco crystal violet | .23 |
| blue dye solution | .39 |
| methyl ethyl ketone | 40 |

The plasticizer used is a block copolymer of polyethylene adipatediol and polypropylene glycol/ethylene oxide, terminated with toluene diisocyanate, at a mole ratio of 1:1:3 respectively, and capped with hydroxypropylmethacrylate, at a mole ratio of 2:1 (hydroxypropylmethacrylate:diisocyanate). The capped terminated block copolymer has a molecular weight of 2439.

A control is prepared in like manner but without plasticizer and precipitated silica.

The films are exposed and developed as in Example 2 and razor blade tests show that the control chips badly while the Example prepared according to this invention doesn't chip, i.e., the Example is more flexible than the control.

EXAMPLE 4

Example and control films are prepared as in Example 3 except that the plasticizer used is N-ethyl-toluene sulfonamide (9.16 parts), and 10.1 parts of precipitated silica are used. The complex viscosity (RMS @60° C.) of Example 4 is $4 \times 10^6$ poise while the control (no precipitated silica and plasticizer) measures $7.8 \times 10^5$ poise, showing the Example more resistant to cold flow than the control. After exposure and development as in Example 3, the Example film doesn't chip when razor tested while the control chips badly showing that the control is less flexible than the Example.

EXAMPLE 5

To show that fumed silica, by itself, does not work in the instant invention, a film is prepared using the same formulation as Example 1. A control is prepared using fumed silica (8.52 parts) instead of precipitated silica. Films are prepared as in Example 2. The film containing fumed silica showed extensive streaking and visible particles, making it unsuitable for photoimaging purposes. The film containing precipitated silica was of good quality having no streaks or visible particles. The fumed silica used has an average primary particle size of 12 nanometers and a surface area of 200 m²/gm.

EXAMPLE 6

To show the use of fumed silica and aluminum oxide in the instant invention, a film is prepared as in Example 2 using the following ingredients:

| Ingredient | Parts |
| --- | --- |
| butylated hydroxy toluene | .01 |
| DMPAP | 4 |
| PBCH | .97 |
| acrylic binder (as in Example 1) | 50.78 |
| TMPTA | 7.48 |
| TDA | 7.48 |
| leuco crystal violet | .34 |
| blue dye solution | .58 |
| fumed silica[1] | 6.33 |
| aluminum oxide[2] | 6.33 |
| tri-n-butyl citrate (plasticizer) | 13.26 |
| methyl ethyl ketone | 50 |

[1]average particle size = 12 nanometers, surface area of 200 m²/gm
[2]average particle size = 20 nanometers; surface area = 100 m²/gm A control is prepared without fumed silica, i.e., aluminum oxide alone. The complex viscosity of Example 6 (RMS @60° C.) is $1.1 \times 10^7$ poise while the control measured $1.7 \times 10^6$ poise showing that the control does not exhibit good resistance to cold flow as does the Example.

The Example 6 film is exposed and developed as in Example 2 and shows a flexible polymerized film that does not chip when razor-cut.

EXAMPLE 7

To show the use of the monofunctional carboxyl group-containing addition photopolymerizable monomer in a preferred embodiment of the instant invention, the following photopolymerizable composition is prepared:

| Component | Grams |
| --- | --- |
| butylated hydroxytoluene | 0.01 |
| DMPAP | 4 |
| PBCH | 0.80 |
| acrylic binder (as in Example 1) | 41.75 |
| TMPTA | 6.15 |
| TDA | 6.15 |
| precipitated silica (as in Example 1) | 10.4 |
| glyceroltriacetate | 10.9 |
| itaconic acid | 1.89 |
| leuco crystal violet | 0.56 |
| blue dye solution | 0.48 |

-continued

| Component | Grams |
| --- | --- |
| methyl ethyl ketone | 27.5 |

A composition of the instant invention is prepared without itaconic acid. Both compositions are stirred several hours at 1000 rpm at room temperature. Films are cast onto polyester film using appropriate doctor blades to obtain a thickness of 37.5 microns. The films are allowed to dry overnight at room temperature. Copper laminate panels are cleaned and scrubbed, and the dry films are laminated to them using a hot shoe laminator at 235° F. at an approximate rate of 4.0 feet per minute. Films are exposed through diazo artwork with a medium pressure mercury vapor arc lamp. The developing is done in dilute alkaline solution at 85° F. Stripping of the cured resist is carried out in a 2 liter beaker equipped with a mechanical stirrer in 3% aqueous potassium hydroxide at 50° C. to evaluate particle size. The panels are examined under a microscope for cleanliness of polymerized material removal between fine lines.

The Example of the instant invention that contains itaconic acid strips in small pieces and the removal of polymerized material from between fine lines is complete. The composition without itaconic acid strips in a large sheet and there is polymerized material between fine lines indicating that further stripping is required.

We claim:

1. In a photopolymerizable composition comprising a carboxyl group-containing, film-forming polymeric binder, a free radical photoinitiator, an addition photopolymerizable monomer, and a thermal polymerization inhibitor, the improvement wherein the composition further comprises:

a. at least one plasticizer in an amount of about 5% to about 20% by weight, wherein the plasticizer is tri-n-butyl citrate, N-ethyltoluene sulfonamide, glycerol triacetate, or reaction product of (i) an isocyanate terminated block copolymer of polyesterdiol blocks selected from the group comprising polyalkylene adipatediol and polyalkylene succinatediol with polyetherdiol blocks comprising polyalkylene glycol/ethylene oxide and (ii) at least one hydroxy substituted acrylate or methacrylate; and b. a siliceous material having a particle size of less than about 10 microns, in an amount of about 13% to 25% by weight, wherein the material is precipitated silica, a combination of fumed silica and aluminum oxide, or a mixture thereof.

2. The composition of claim 1, wherein the plasticizer is tri-n-butyl citrate.

3. The composition of claim 1, wherein the plasticizer is N-ethyl-toluene sulfonamide.

4. The composition of claim 1, wherein the polyesterdiol blocks are polyethylene adipatediol blocks.

5. The composition of claim 1, wherein the polyalkylene glycol is polypropylene glycol.

6. The composition of claim 1, wherein the hydroxy substituted acrylate or methacrylate is hydroxypropylmethacrylate or polypropylene glycol monomethacrylate.

7. The composition of claim 1, wherein the siliceous material is precipitated silica.

8. The composition of claim 1, wherein the siliceous material is a combination of fumed silica and aluminum oxide.

9. In a photopolymerizable element comprising a photopolymerizable composition sandwiched between a support member and a cover member, the improvement wherein the photopolymerizable composition is the photopolymerizable composition of claim 1.

10. The composition of claim 1 further comprising a monofunctional carboxyl group-containing addition photopolymerizable monomer.

11. The composition of claim 10, wherein the monofunctional carboxyl group-containing addition photopolymerizable monomer is itaconic acid.

12. The composition of claim 10, wherein the monofunctional carboxyl group-containing addition photopolymerizable monomer is beta-carboxyethylacrylate.

* * * * *